(12) United States Patent
Breinlinger

(10) Patent No.: US 6,784,656 B2
(45) Date of Patent: Aug. 31, 2004

(54) HYBRID CONDUCTOR-BOARD FOR MULTI-CONDUCTOR ROUTING

(75) Inventor: Keith Breinlinger, Hampstead, NH (US)

(73) Assignee: Teradyne, Inc., Boston, MA (US)

( * ) Notice: Subject to any disclaimer, the term of this patent is extended or adjusted under 35 U.S.C. 154(b) by 216 days.

(21) Appl. No.: 09/943,267

(22) Filed: Aug. 30, 2001

(65) Prior Publication Data

US 2003/0042912 A1 Mar. 6, 2003

(51) Int. Cl.[7] ............................................. G01R 31/02
(52) U.S. Cl. .................................. 324/158.1; 324/754
(58) Field of Search ............................. 324/754, 158.1, 324/762, 755, 756, 757, 758; 29/825, 885; 439/219

(56) References Cited

U.S. PATENT DOCUMENTS

| 4,472,728 A | * | 9/1984 | Grant et al. ................... 357/30 |
| 5,531,022 A | * | 7/1996 | Beaman et al. ................ 29/850 |
| 5,703,747 A | * | 12/1997 | Voldman et al. ............ 361/111 |

* cited by examiner

Primary Examiner—David A. Zarneke
Assistant Examiner—Trung Q. Nguyen
(74) Attorney, Agent, or Firm—Lance Kreisman

(57) ABSTRACT

A router for funneling a plurality of conductors is disclosed. The router includes a routing unit and a plurality of conductor paths. The conductor paths are directed through the routing unit and are adapted to receive the conductors. The routing unit and the plurality of conductor paths are formed by a three-dimensional fabrication process.

16 Claims, 5 Drawing Sheets

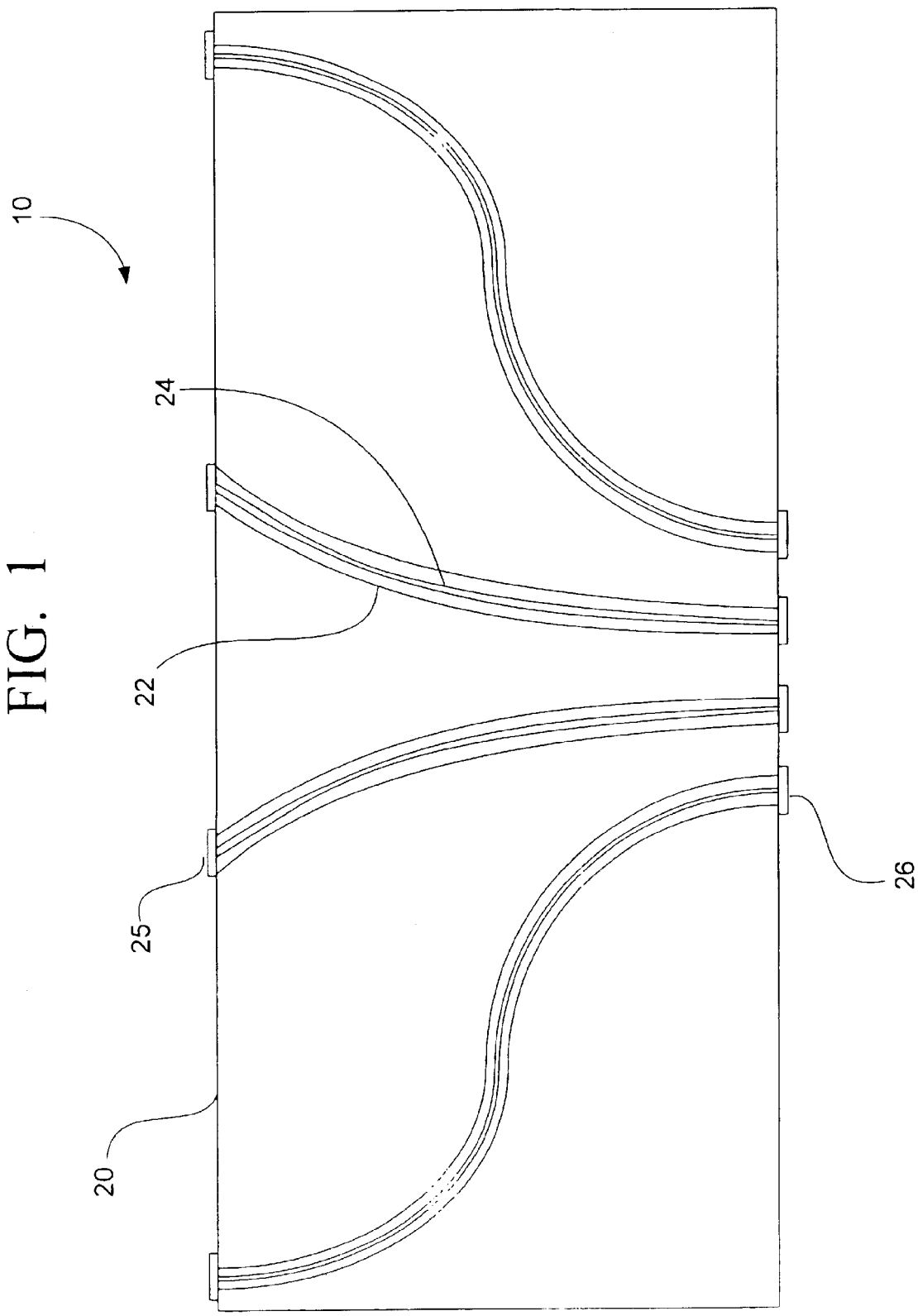

HYBRID CONDUCTOR-BOARD FOR MULTI-CONDUCTOR ROUTING

FIELD OF THE INVENTION

The invention relates generally to multi-conductor routing schemes, and more particularly a hybrid conductor-board for straightforward and cost-effective conductor routing.

BACKGROUND OF THE INVENTION

Sophisticated electronic assemblies often employ dense arrays of electrical conductors to transmit signals from one area to another. Routing large groups of conductors in an efficient and organized manner often proves problematic for a variety of reasons. The overall assembly cost, formfactor (size) and complexity all must typically be taken into account to determine a suitable routing method.

One method of routing groups of signal conductors from one area to another involves bundling the conductors together into a harness, and selectively branching individual conductors off from the main branch as needed. This is a fairly common and well-known technique where routing space is often plentiful. Moreover, for high fidelity applications, true cables (coaxial, fiber optic, etc.) may be employed to transmit high-frequency signals with the maximum possible signal quality. However, for systems and assemblies requiring high-density and compactness, harnesses are often not the best solution.

A common method of routing large groups of signal conductors in a compact format involves the use of printed circuit boards, or PCBs. These assemblies are rigid board-like structures having one or more layers. Each layer comprises a substrate formed with a pattern of conductors. Depending on the application, hundreds to thousands of conductors may be routed by a single PCB.

For complex multi-layer boards, the conductor, or "trace" dimensions may be very small, and typically comprise a "surface-mount" structure etched or deposited upon the substrate. Layer to layer connections are made through the use of vertically formed vias. High-frequency signals up to around one gigahertz may be transmitted along these traces with somewhat acceptable degradation, especially where signal and ground layers are alternated to create somewhat of a non-ideal transmission line as is well-known in the art.

Unfortunately, signals propagating above one gigahertz incur substantial losses along conventional PCB traces due to a variety of factors. In short, the physical limits of conventional PCB technology have been challenged and surpassed as signal frequencies increase for many electronic assemblies and systems. What is needed and heretofore unavailable is a hybrid harness/PCB structure that provides a straightforward, low-cost and efficient solution to the problems identified above. The hybrid conductor-board of the present invention satisfies this need.

SUMMARY OF THE INVENTION

The hybrid conductor-board of the present invention provides a cost-effective and straightforward way to route dense arrays of high frequency conductors with minimal signal degradation.

To realize the foregoing advantages, the invention in one form comprises a router for funneling a plurality of conductors. The router includes a routing unit and a plurality of conductor paths. The conductor paths are directed through the routing unit and are adapted to receive the conductors. The routing unit and the plurality of conductor paths are formed by a three-dimensional fabrication process.

In another form, the invention comprises a hybrid conductor/board including a router having a routing unit and a plurality of conductor paths directed through the routing unit. A plurality of conductors are routed through the conductor paths.

In yet another form, the invention comprises an automatic test equipment interface for funneling signal conductors from a plurality of pin electronics boards to one or more devices-under-test. The interface includes a hybrid conductor/board comprising a signal router having a routing unit and a plurality of conductor paths directed through the routing unit. A plurality of signal conductors are routed through the conductor paths. The hybrid conductor/board has first and second planar surfaces with the first planar surface adapted for coupling to the pin electronics boards. A device interface board couples to the second planar surface and is adapted to connect to the one or more devices-under-test.

Other features and advantages of the present invention will be apparent from the following detailed description when read in conjunction with the accompanying drawings.

BRIEF DESCRIPTION OF THE DRAWINGS

The invention will be better understood by reference to the following more detailed description and accompanying drawings in which FIG. 1 is a partial cross-sectional view of a hybrid cable-board according to one form of the present invention;

DETAILED DESCRIPTION OF THE INVENTION

Figure 2A:
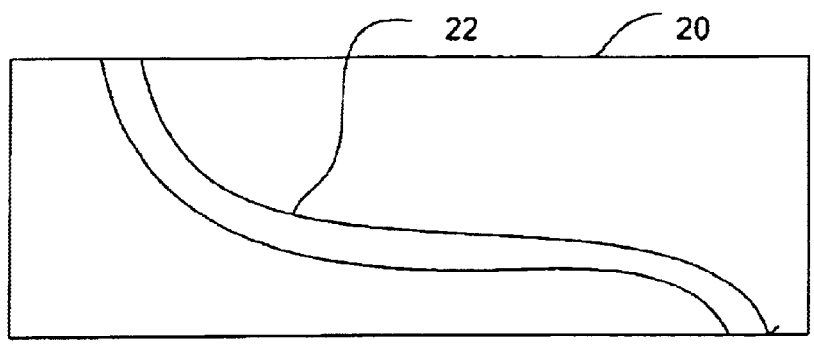
FIGS. 2a–2d are diagrams illustrating one method of fabricating the hybrid cable-board of FIG. 1.

The hybrid conductor/board of the present invention, shown in FIG. 1 and generally designated 10, provides a straightforward and cost-effective way to route large quantities of signal conductors while maintaining optimal signal quality over the conductors. This is accomplished through the use of a router 20 uniquely formed to receive a plurality of conductors 24. By employing a true three-dimensional way of routing conductors on a mass scale, the complexities, costs, and performance limitations of PCB fabrication are eliminated.

Further referring to FIG. 1, the signal router 20 comprises a block of rigid material formed with a plurality of open-ended hollow paths 22. The paths are constructed to complementally receive the respective signal conductors 24. Terminated at each end of the paths, the conductors are coupled to respective contact arrays 25 and 26 for interfacing with, for example, connector contacts, discrete component contacts, semiconductor package contacts, or the like. The overall shape of the router block is unimportant to the present invention.

Referring now to FIGS. 2A–2D, the signal router 20 is preferably formed of a material suitable for being incrementally processed through a 3-D additive technique, such as stereolithography (SLA), selective laser scintering (SLS), fused deposition modeling (FDM), and laminated object manufacturing (LOM), to name but a few. SLA comprises the preferred method of fabrication due to its known desirable resolution capabilities. Materials such as Vantico SL5510 or 5530 work well for the preferred embodiment.

Generally, the 3-D additive process incrementally builds-up the signal router 20 and conductor paths 22, such as that shown in FIG. 2a. While only one conductor path is shown for simplicity, it should be understood that several thousand paths may be formed simultaneously through a single router. Moreover, while 3-D additive processes are preferred, 3-D subtractive processes are also envisioned within the scope of the present invention.

Figure 2B:
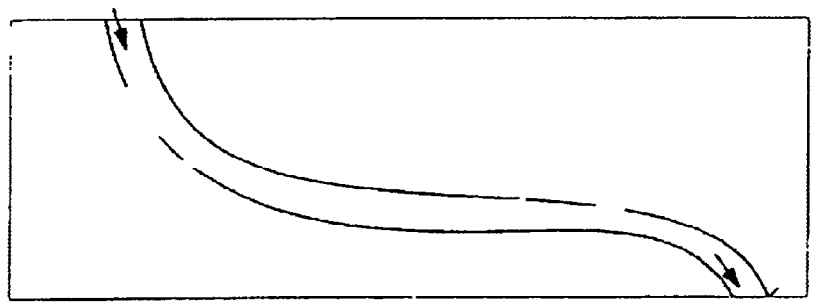
Figure 2C:
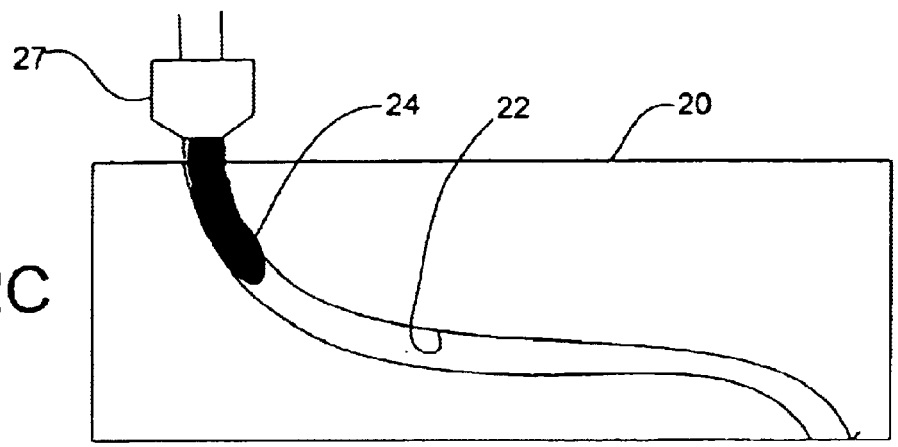

Once the signal router structure is complete, a slurry of fine particles may be employed, as shown in FIG. 2b, to clear any debris in any of the conductor paths. Once cleared, the paths are ready for insertion of the respective signal conductors 24, shown in FIG. 2c. Insertion is accomplished by using, for example, an actuated clamping collet 27, such that each conductor is gripped and pushed into the hollow path 22.

Figure 2D:
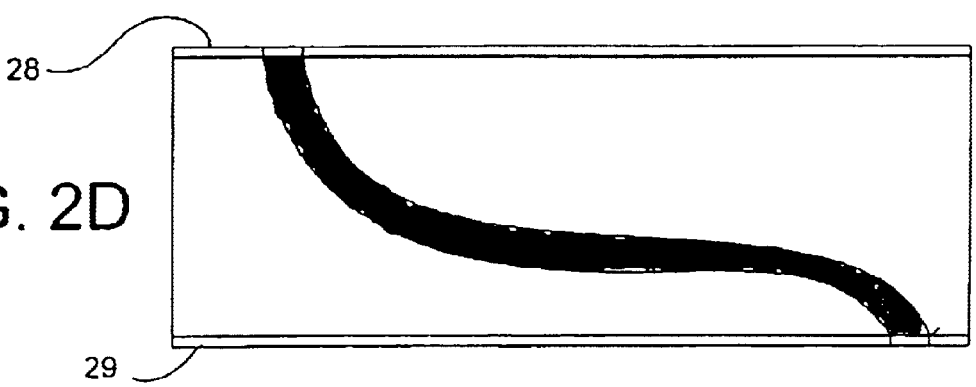

Following insertion of all of the signal conductors, the assembly may be finished depending on the application. For example, in the embodiment illustrated in FIG. 1, the conductor ends are terminated, and contacts deposited on each side to form the respective contact arrays 25 and 26. Alternatively, as shown in FIG. 2D, pre-formed plates 28 and 29 may be attached to the top and bottom of the router, followed by milling and plating steps (not shown) to form respective interface arrays.

Figure 3:
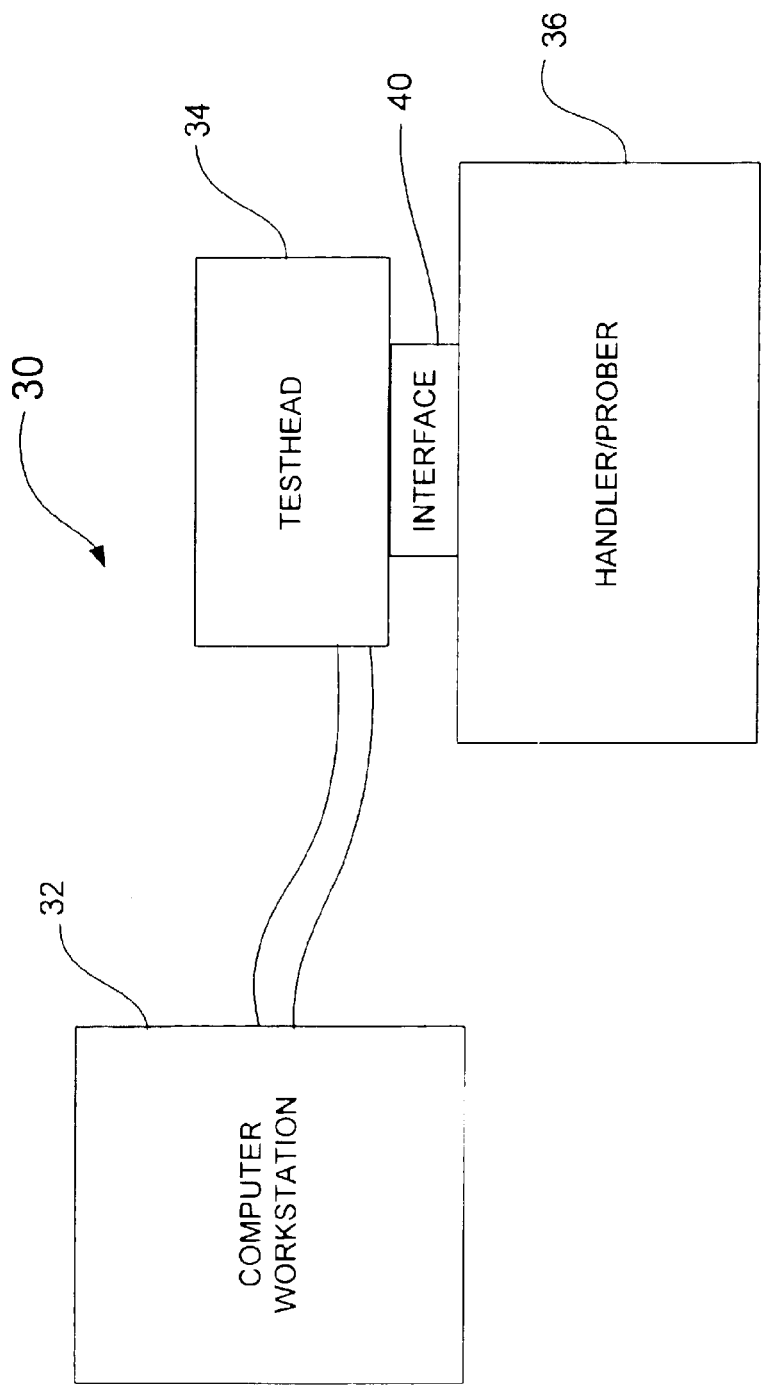
FIG. 3 is a high-level block diagram of automatic test equipment employing the hybrid cable-board of FIG. 1 in an ATE interface.

The hybrid conductor-board 10 (FIG. 1) is beneficial for a variety of electronic and/or fiber optic applications requiring point-to-point routing and/or funneling of large numbers of conductors. Referring now to FIG. 3, the invention is especially useful in automatic test equipment (ATE) interface applications.

With continuing reference to FIG. 3, automatic test equipment generally employs up to several thousand channels of electronic circuitry, commonly referred to as pin electronics, that interface to one or more devices-under-test (DUTs—not shown) to verify operability, etc. The equipment, generally designated 30, includes a computer workstation 32 that couples to a testhead 34. The testhead encloses the channel circuitry in an effort to position the electronics as close as possible to the DUTs (which are positioned on a handler/prober 36). In order to funnel the thousand of tester signal channels from the relatively large testhead connections to the very densely packed prober or handler connections, an ATE interface 40 is interposed therebetween.

Figure 4:
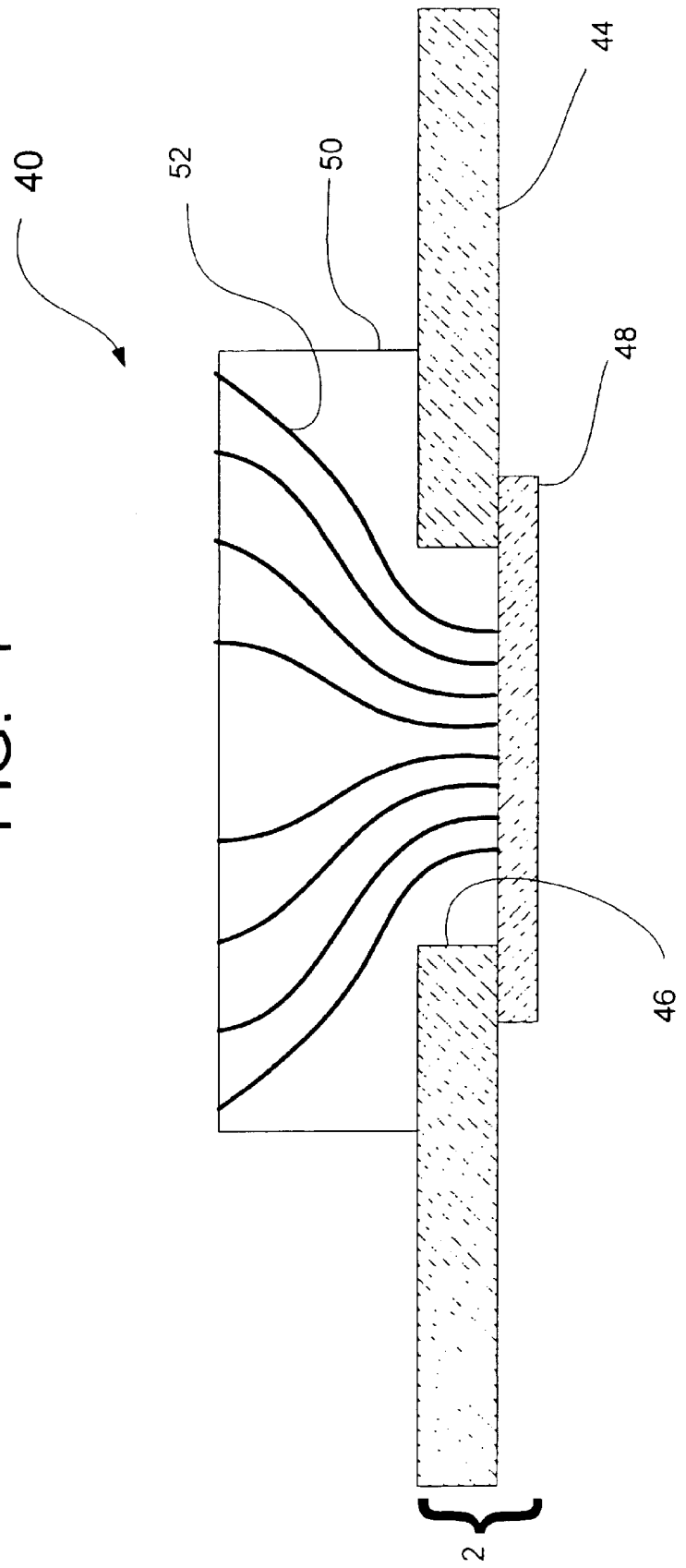
FIG. 4 is a side view of the interface employed in the automatic test equipment interface of FIG. 3.

Referring now to FIG. 4, an ATE interface according to one form of the present invention, generally designated 40, includes a device interface board 42 comprising a stiffener 44 formed with a central opening 46 and a high-density device coupling unit 48 (such as a socket array for mounting packaged devices, or a probe array for touching down on wafer contacts). A signal router 50, formed similar to the router described above, mounts to the device interface board and includes an array of coaxial cables 52 terminated along a common plane to engage corresponding contacts of the device coupling unit 48.

To provide minimal channel-to-channel delay variations, the router may be formed such that each of the inserted cables are of the same length. This is straightforwardly accomplished through the use of the 3-D additive fabrication process described earlier. Moreover, the router may include an assortment of different conductors, such as twisted pair cables, coaxial cables, fiber optic cables, and the like.

Figure 5:
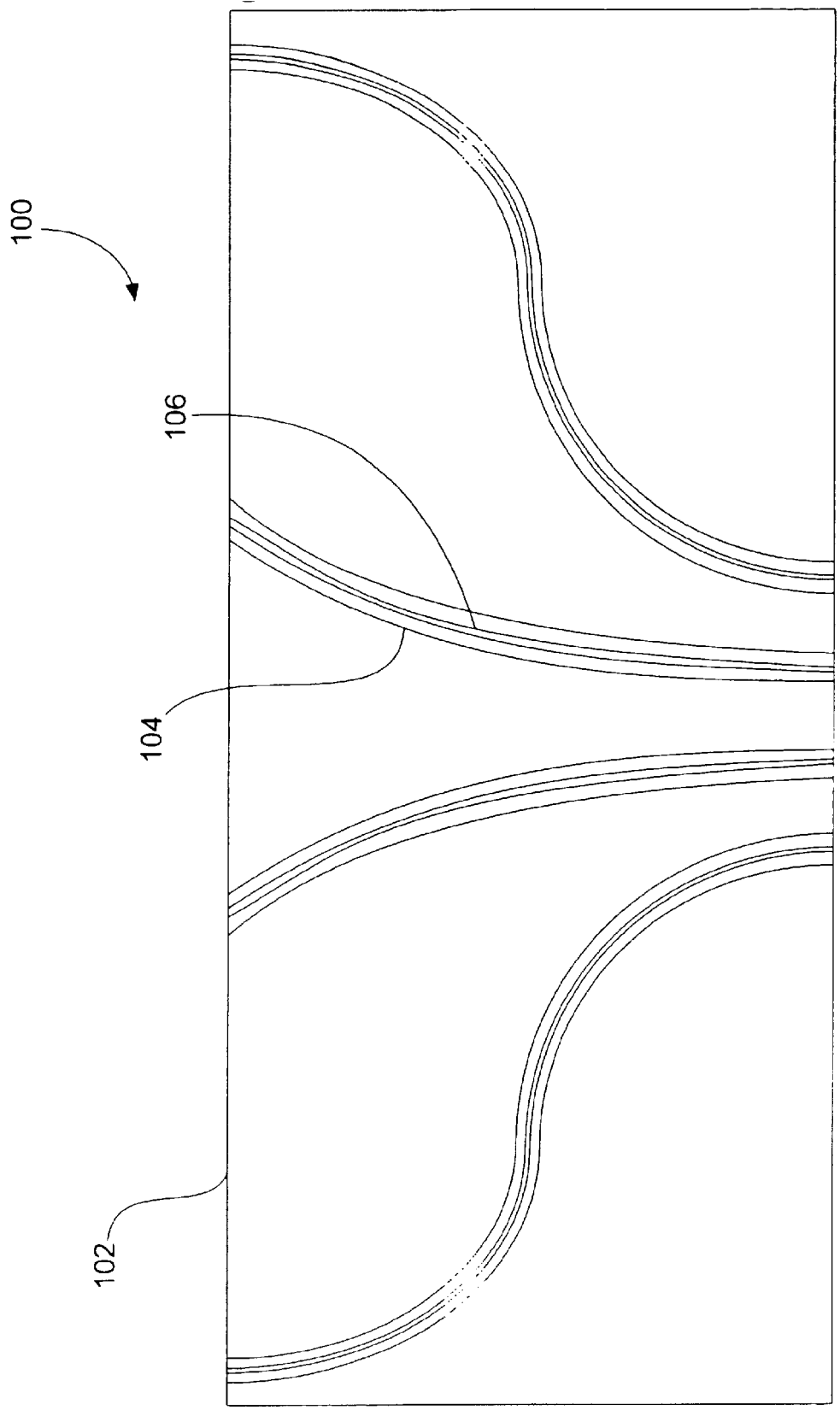
FIG. 5 is a partial cross-sectional view of a hybrid board according to a second embodiment of the present invention.

Referring now to FIG. 5, a further embodiment of the present invention, generally designated 100, expands the concept of utilizing a 3-D fabrication process to create conductor paths 104 in a router 102 to fluid cooling and distribution applications. Like the previously described embodiments, the router and associated paths are formed by a 3-D fabrication process. However, instead of receiving electrical conductors, the conductor paths receive fluid conductors in the form of tubes 106 to route fluid through the unit. The tubes provide an advantage by minimizing fluid leaks through the router.

Those skilled in the art will appreciate the many benefits and advantages afforded by the present invention. In particular, funneling large arrays of conductors from a low-density array to a high-density array may be easily accomplished by a low-cost and highly manufacturable method. Additionally, by enabling the use of true transmission lines with low dielectrics as signal conductors as opposed to microstrip traces that simulate transmission lines to certain limits, signal fidelity is maximized over a wide bandwidth passing beyond several gigahertz.

While the invention has been particularly shown and described with reference to the preferred embodiments thereof, it will be understood by those skilled in the art that various changes in form and detail may be made therein without departing from the spirit and scope of the invention.

What is claimed is:

1. A router for guiding a plurality of conductors, the router including:
   a routing unit having first and second surfaces and formed with a plurality of contiguous open-ended hollow paths, the open-ended hollow paths being directed in a free-form manner from the first surface through the routing unit to the second surface and adapted for receiving the plurality of conductors, the routing unit constructed in accordance with a three dimensional fabrication process including the steps
   incrementally forming a portion of the router; and
   iterating the incrementally forming step until the router is complete.

2. A router according to claim 1 wherein the incrementally forming step comprises a three-dimensional additive technique.

3. A router according to claim 1 wherein the incrementally forming step comprises a three-dimensional subtractive technique.

4. A router according to claim 1 wherein the routing unit comprises a block of dielectric material.

5. A router according to claim 1 wherein the routing unit comprises a block of thermally conductive material.

6. A hybrid conductor/board comprising:
   a routing unit having first and second surfaces and formed with a plurality of contiguous open-ended hollow paths, the open-ended hollow paths being directed in a free-form manner from the first surface through the routing unit to the second surface, the routing unit constructed in accordance with a process including the steps
   incrementally forming a portion of the router; and
   iterating the incrementally forming step until the router is complete; the hybrid conductor/board further including
   a plurality of conductors routed through the contiguous open-ended hollow paths.

7. A hybrid conductor/board according to claim 6 wherein at least one of the plurality of conductors comprises an electrical conductor.

8. A hybrid conductor/board according to claim 6 wherein at least one of the plurality of conductors comprises an optical conductor.

9. A hybrid conductor/board according to claim 6 wherein at least one of the plurality of conductors comprises a fluid conductor.

10. A hybrid conductor/board according to claim 6 wherein the incrementally forming step comprises a three-dimensional additive technique.

11. A hybrid conductor/board according to claim 6 wherein the incrementally forming step comprises a three-dimensional subtractive technique.

12. A hybrid conductor/board according to claim 6 wherein:
the routing unit first and second surfaces comprise oppositely disposed planar surfaces; and
the plurality of conductors extend from one planar surface to the other planar surface, and include respective opposite ends terminated on each of the respective planar surfaces to form respective first and second contact arrays.

13. A hybrid conductor/board according to claim 12 wherein:
the first contact array has a contact-to-contact spacing substantially greater than that of the second contact array.

14. An automatic test equipment interface for funneling signal conductors from a plurality of pin electronics boards to one or more devices-under-test, the interface including:
a hybrid conductor/board comprising:
a routing unit having first and second surfaces and formed with a plurality of contiguous open-ended hollow paths, the open-ended hollow paths being directed in a free-form manner from the first surface through the routing unit to the second surface,
a plurality of conductors routed through the contiguous open-ended hollow paths; and
a device interface board for coupling to the hybrid conductor/board and adapted to connect to the one or more devices-under-test.

15. An automatic test equipment interface according to claim 14 wherein the plurality of conductors are of equal length.

16. Automatic test equipment for testing one or more devices-under-test, the automatic test equipment including:
a computer workstation; and
a testhead coupled to the computer workstation and including
a plurality of pin electronics boards, and
an interface for funneling signal conductors from the pin electronics boards to the one or more devices-under-test, the interface including
a hybrid conductor/board comprising:
a routing unit having first and second surfaces and formed with a plurality of contiguous open-ended hollow paths, the open-ended hollow paths being directed in a free-form manner from the first surface through the routing unit to the second surface,
a plurality of conductors routed through the contiguous open-ended hollow paths; and
a device interface board for coupling to the hybrid conductor/board and adapted to connect to the one or more devices-under-test.

* * * * *